US007637599B2

(12) United States Patent
Ota

(10) Patent No.: US 7,637,599 B2
(45) Date of Patent: Dec. 29, 2009

(54) LIQUID EJECTION HEAD, METHOD OF MANUFACTURING SAME, AND IMAGE FORMING APPARATUS

(75) Inventor: Hiroshi Ota, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 428 days.

(21) Appl. No.: 11/404,908

(22) Filed: Apr. 17, 2006

(65) Prior Publication Data

US 2006/0232640 A1 Oct. 19, 2006

(30) Foreign Application Priority Data

Apr. 18, 2005 (JP) ............................ 2005-119823

(51) Int. Cl.
*B41J 2/045* (2006.01)
*H01L 21/00* (2006.01)
*G03F 1/00* (2006.01)

(52) U.S. Cl. ......................... 347/68; 430/315; 430/319; 430/320

(58) Field of Classification Search .................. 347/68, 347/70–72; 430/315, 319, 320
See application file for complete search history.

(56) References Cited

U.S. PATENT DOCUMENTS 5,818,482 A * 10/1998 Ohta et al. .................... 347/70
6,734,460 B2 * 5/2004 Okumura et al. .............. 257/72
6,796,640 B2 * 9/2004 Miyata ........................ 347/71

FOREIGN PATENT DOCUMENTS

JP 2001-113700 A 4/2001

* cited by examiner

*Primary Examiner*—An H Do
(74) *Attorney, Agent, or Firm*—Birch, Stewart, Kolasch & Birch, LLP

(57) ABSTRACT

The method manufactures a liquid ejection head having a diaphragm which forms a portion of pressure chambers connected to nozzles ejecting liquid, and piezoelectric elements which deform the diaphragm. The method includes the steps of: applying a photosensitive resin on at least a portion of each of electrodes of the piezoelectric elements; bonding a substrate having through holes, to the photosensitive resin; exposing the photosensitive resin via the through holes; developing the exposed photosensitive resin, thereby forming holes connecting to the through holes in the photosensitive resin; and filling conductive material into the through holes and the holes formed in the photosensitive resin.

6 Claims, 9 Drawing Sheets

LIQUID EJECTION HEAD, METHOD OF MANUFACTURING SAME, AND IMAGE FORMING APPARATUS

BACKGROUND OF THE INVENTION

1. Field of the Invention

The present invention relates to a liquid ejection head, a method of manufacturing same, and an image forming apparatus, and more particularly to a liquid ejection head, a method of manufacturing same and an image forming apparatus, in which connections for drive wires which supply drive signals to piezoelectric elements are devised, in a liquid ejection head using the piezoelectric elements as pressure generating devices for ejecting liquid.

2. Description of the Related Art

As an image forming apparatus, an inkjet printer (inkjet recording apparatus) is known, which comprises an inkjet head (liquid ejection head) having an arrangement of a plurality of nozzles (ejection ports) for ejecting ink (liquid) and which forms images on a recording medium by ejecting ink from the nozzles toward the recording medium, while causing the inkjet head and the recording medium to move relatively to each other.

For example, as an ink ejection method for an inkjet recording apparatus of this kind, a piezoelectric method is known, in which a diaphragm which constitutes one face of a pressure chamber is deformed by the deformation of a piezoelectric element by using the piezoelectric element as a pressure generating device for ejecting ink, thereby changing the volume of the pressure chamber, ink is introduced into the pressure chamber from an ink supply passage when the volume of the pressure chamber is increased, and the ink inside the pressure chamber is ejected from a nozzle in the form of an ink droplet when the volume of the pressure chamber is decreased.

Furthermore, in recent years, it has been sought to form high-quality images similar to photographic prints, with inkjet recording apparatuses of this kind, and for this purpose, it has been necessary further to reduce the size of the ink droplets ejected from the nozzles by reducing the size of the nozzles, as well as arranging a plurality of nozzles at higher density.

This in turn requires the pressure chambers which are connected to the nozzles to be disposed in a high-density arrangement, in conjunction with the increased density of the nozzles. Furthermore, the electrical wires (drive wires) which supply drive signals to the piezoelectric elements disposed corresponding to the pressure chambers must also be arranged at higher density. Various proposals have been made in order to achieve higher density arrangement of the nozzles in this manner.

For example, Japanese Patent Application Publication No. 2001-113700 discloses an inkjet head in which, in order to provide an inkjet head which readily achieves a large number of nozzles and high density arrangement of the nozzles, it is sought to reduce the size of the head by electrically connecting energy generating devices (piezoelectric elements) on a head substrate with connection devices (drive wires), via through holes provided in the head substrate.

As described above, in order to achieve high recording speed and high image quality in an inkjet recording apparatus, it is essential to increase the number of nozzles and to arrange the nozzles at higher density, and consequently, the number of wires providing the electrical connections to the piezoelectric elements corresponding to the nozzles increase in number. It is difficult to increase the density of the wiring, by means of a one-dimensional or a two-dimensional wiring arrangement in which the wires are extended in a horizontal direction, and hence it is necessary to adopt a three-dimensional wiring arrangement using through holes, for example.

Furthermore, as described above, in an inkjet recording head based on a piezoelectric method, a portion of each of the pressure chambers connected to the nozzle openings which eject ink droplets is constituted by a diaphragm, and by causing this diaphragm to deform by means of a piezoelectric element, the ink in the pressure chamber is pressurized, and an ink droplet is ejected from the corresponding nozzle opening. There are two types of piezoelectric elements, namely, the vertical vibration mode (d33 mode), in which the piezoelectric element deforms in the same direction as the direction of the electric field, and expands and contracts in the axial direction, and the bending vibration mode (d31 mode), in which the piezoelectric element deforms in a direction perpendicular to the direction of the electric field, and the piezoelectric element bends.

In the case of a system which uses a piezoelectric element operating in the vertical vibration mode, it is possible to increase the amount of displacement of the piezoelectric element in the direction toward the diaphragm, by holding the piezoelectric element from the opposite side to the diaphragm, with a fixed plate. Therefore, it is possible to make the upper part of the piezoelectric element adhere closely to the fixed plate. Consequently, it is possible to form piezoelectric elements previously on the surface of the fixed plate, and to form wires in a through hole shape in the fixed plate, in order to connect to the electrodes of the piezoelectric elements.

On the other hand, when using piezoelectric elements operating in the bending vibration mode, if the piezoelectric elements adhere tightly to the fixed plate, then it is not possible for the piezoelectric elements to bend, and therefore, a space which allows the piezoelectric elements to bend must be ensured on the opposite side of the piezoelectric elements from the diaphragm (namely, a space which prevents obstruction of the movement of the piezoelectric elements). Moreover, in order to protect the piezoelectric elements, this space must be a hermetically sealed space which covers the upper portion of each piezoelectric element. Therefore, when using piezoelectric elements operating in the bending vibration mode, connections with the through holes on the upper side must be made within this hermetically sealed space.

However, in the head described in Japanese Patent Application Publication No. 2001-113700, the electrical connections to the piezoelectric elements are made via through holes provided in the head substrate directly below the piezoelectric elements, but no consideration is given to providing spaces for preventing obstruction of the movement of the piezoelectric elements, as required when piezoelectric elements operating in the bending vibration mode are used as described above. If piezoelectric elements operating in the bending vibration mode are used, then a problem arises when it is sought to make the electrical connections via these through holes.

For example, when the electrodes of the piezoelectric elements are connected to the wires via through holes, then if a semi-fluid material, such as solder, conductive paste, or the like, is used, the semi-fluid material may be project beyond the region where it is originally required, inside the hermetically sealed space, and hence there is a risk that this projecting material may obstruct the movement of the piezoelectric elements. Furthermore, since the electrical connections are made within a hermetically sealed space, it is not possible to confirm the connection status, and there is a risk of connection defects.

SUMMARY OF THE INVENTION

The present invention has been contrived in view of the foregoing circumstances, an object thereof being to provide a liquid ejection head, a method of manufacturing same, and an image forming apparatus, whereby reliable wiring can be formed to the electrodes of piezoelectric elements, via through holes provided above the piezoelectric elements, even if spaces for preventing obstruction of the movement of piezoelectric elements driven in a bending vibration mode are provided above the piezoelectric elements, and whereby the wires inside the through holes can be formed together in one operation, without obstructing the movement of the piezoelectric elements, even if a conductive material having fluid characteristics is used to form the wires.

In order to attain the aforementioned object, the present invention is directed to a method of manufacturing a liquid ejection head having a diaphragm which forms a portion of pressure chambers connected to nozzles ejecting liquid, and piezoelectric elements which deform the diaphragm, the method comprising the steps of: applying a photosensitive resin on at least a portion of each of electrodes of the piezoelectric elements; bonding a substrate having through holes, to the photosensitive resin; exposing the photosensitive resin via the through holes; developing the exposed photosensitive resin, thereby forming holes connecting to the through holes in the photosensitive resin; and filling conductive material into the through holes and the holes formed in the photosensitive resin.

Accordingly, positional registration of the holes for the wires connecting to the electrodes is not necessary, and electrical connections can be formed without the conductive paste used to form the wires adhering to parts other than the required locations.

In order to attain the aforementioned object, the present invention is also directed to a liquid ejection head, comprising: a diaphragm which forms a portion of pressure chambers connected to nozzles ejecting liquid; piezoelectric elements which deform the diaphragm; a photosensitive resin which is applied on at least a portion of each of electrodes of the piezoelectric elements; a substrate having through holes which is bonded to the photosensitive resin on a side reverse to a side adjacent to the piezoelectric elements; and wires which pass through the substrate and the photosensitive resin, and connect electrically to the electrodes of the piezoelectric elements.

Accordingly, since the connection sections between the electrodes and the wires are fixed by photosensitive resin, then it is possible to prevent disconnection of the connection sections due to the driving of the piezoelectric elements.

Preferably, spaces allowing the piezoelectric elements to bend are provided respectively between the piezoelectric elements and the substrate; and the piezoelectric elements are driven in a bending vibration mode.

Accordingly, there is no obstruction of the bending deformation of the piezoelectric elements, and therefore it is possible to improve the driving displacement of the piezoelectric elements.

Preferably, the substrate has a common liquid chamber which accumulates the liquid to be supplied to the pressure chambers.

Accordingly, it is possible to achieve a high-density arrangement of the pressure chambers, as well as improving the liquid refilling properties and becoming able to handle the ejection of liquids of high viscosity.

In order to attain the aforementioned object, the present invention is also directed to an image forming apparatus, comprising the above-described liquid ejection head.

Accordingly, it is possible to form high-quality images by means of nozzles arranged at high density.

As described above, according to the present invention, positional registration of the holes for the wires connecting to the electrodes is not necessary, and electrical connections can be formed without the conductive paste used to form the wires adhering to parts other than the required locations.

Furthermore, if the piezoelectric elements are driven in d31 mode, and if spaces for preventing obstruction to the driving of the piezoelectric elements are formed respectively between the piezoelectric elements and the substrate, then there is no obstruction of the bending deformation of the piezoelectric elements, and therefore the driving displacement of the piezoelectric elements can be increased.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1:
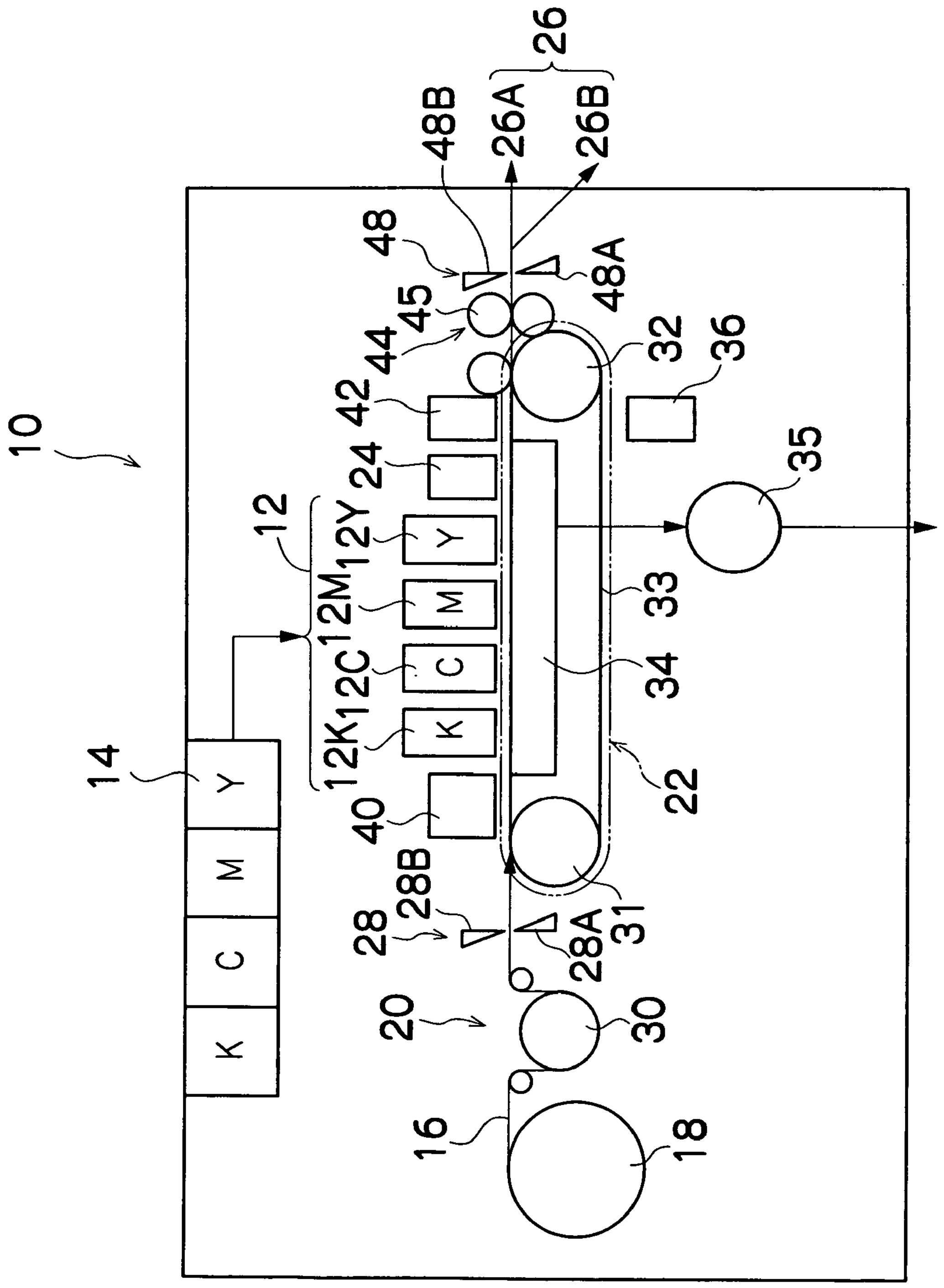
FIG. 1 is a general schematic drawing showing an approximate view of an inkjet recording apparatus forming an image forming apparatus comprising a liquid ejection head (print head) according to an embodiment of the present invention.

FIG. 1 is a general schematic drawing showing an approximate view of a first embodiment of an inkjet recording apparatus forming an image forming apparatus having a liquid ejection head according to the present invention.

As shown in FIG. 1, the inkjet recording apparatus 10 comprises: a print unit 12 having a plurality of print heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16 supplied from the paper supply unit 18; a belt conveyance unit 22 disposed facing the nozzle face (ink-droplet ejection face) of the print unit 12, for conveying the recording paper 16 while keeping the recording paper 16 flat; a print determination unit 24 for reading the printed result produced by the print unit 12; and a paper output unit 26 for outputting image-printed recording paper (printed matter) to the exterior.

In FIG. 1, a magazine for rolled paper (continuous paper) is shown as an embodiment of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

The decurled and cut recording paper 16 is delivered to the belt conveyance unit 22. The belt conveyance unit 22 has a configuration in which an endless belt 33 is set around rollers 31 and 32 so that the portion of the endless belt 33 facing at least the nozzle face of the print unit 12 and the sensor face of the print determination unit 24 forms a plane (flat plane).

There are no particular limitations on the structure of the belt conveyance unit 22, and it may use vacuum suction conveyance in which the recording paper 16 is conveyed by being held on the belt 33 by negative pressure created by suctioning air through suction holes provided on the belt surface, or it may be based on electrostatic attraction.

The belt 33 has a width dimension that is broader than the width of the recording paper 16, and in the case of the vacuum suction conveyance method described above, a plurality of suction holes (not shown) are formed in the surface of the belt. A suction chamber 34 is disposed in a position facing the sensor surface of the print determination unit 24 and the nozzle surface of the print unit 12 on the interior side of the belt 33, which is set around the rollers 31 and 32, as shown in FIG. 1. The suction chamber 34 provides suction with a fan 35 to generate a negative pressure, and the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, embodiments thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism, in which the recording paper 16 is pinched and conveyed with nip rollers, instead of the belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the print unit 12 in the conveyance pathway formed by the belt conveyance unit 22. The heating fan 40 blows heated air onto the recording paper 16 to heat the recording paper 16 immediately before printing so that the ink deposited on the recording paper 16 dries more easily.

Figure 2:
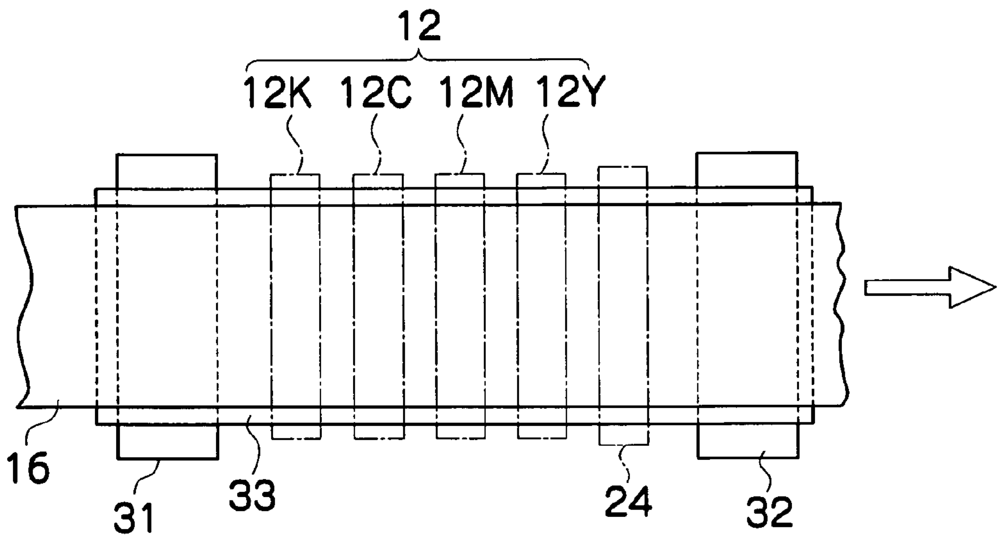
FIG. 2 is a principal plan diagram showing the peripheral area of a print unit of the inkjet recording apparatus.

FIG. 2 is a principal plan diagram showing the periphery of the print unit 12 in the inkjet recording apparatus 10.

As shown in FIG. 2, the print unit 12 is a so-called "full line head" in which a line head having a length corresponding to the maximum paper width is arranged in a direction (main scanning direction) that is perpendicular to the paper conveyance direction (sub-scanning direction).

Each of the print heads 12K, 12C, 12M, and 12Y is constituted by a line head, in which a plurality of ink ejection ports (nozzles) are arranged along a length that exceeds at least one side of the maximum-size recording paper 16 intended for use in the inkjet recording apparatus 10.

The print heads 12K, 12C, 12M, and 12Y are arranged in the order of black (K), cyan (C), magenta (M), and yellow (Y) from the upstream side (left-hand side in FIG. 1), along the conveyance direction of the recording paper 16 (paper conveyance direction). A color image can be formed on the recording paper 16 by ejecting the inks from the print heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the paper conveyance direction (sub-scanning direction) just once (in other words, by means of a single subscan). Higher-speed printing is thereby made possible and productivity can be improved in comparison with a shuttle type head configuration in which a print head moves reciprocally in a direction (main scanning direction) that is perpendicular to paper conveyance direction.

Here, the terms main scanning direction and sub-scanning direction are used in the following senses. More specifically, in a full-line head comprising rows of nozzles that have a length corresponding to the entire width of the recording paper, "main scanning" is defined as printing one line (a line formed of a row of dots, or a line formed of a plurality of rows of dots) in the breadthways direction of the recording paper (the direction perpendicular to the conveyance direction of the recording paper) by driving the nozzles in one of the following ways: (1) simultaneously driving all the nozzles; (2) sequentially driving the nozzles from one side toward the other; and (3) dividing the nozzles into blocks and sequentially driving the blocks of the nozzles from one side toward the other. The direction indicated by one line recorded by a main scanning action (the lengthwise direction of the band-shaped region thus recorded) is called the "main scanning direction".

On the other hand, "sub-scanning" is defined as to repeatedly perform printing of one line (a line formed of a row of dots, or a line formed of a plurality of rows of dots) formed by the main scanning action, while moving the full-line head and the recording paper relatively to each other. The direction in which sub-scanning is performed is called the sub-scanning direction. Consequently, the conveyance direction of the recording paper is the sub-scanning direction and the direction perpendicular to same is called the main scanning direction.

Although the configuration with the KCMY four standard colors is described in the present embodiment, combinations of the ink colors and the number of colors are not limited to those. Light inks or dark inks can be added as required. For example, a configuration is possible in which print heads for ejecting light-colored inks such as light cyan and light magenta are added.

As shown in FIG. 1, the ink storing and loading unit 14 has ink tanks for storing the inks of the colors corresponding to the respective print heads 12K, 12C, 12M, and 12Y, and the respective tanks are connected to the print heads 12K, 12C, 12M, and 12Y by means of channels (not shown). The ink storing and loading unit 14 has a warning device (for example, a display device or an alarm sound generator) for warning when the remaining amount of any ink is low, and has a mechanism for preventing loading errors among the colors.

The print determination unit 24 has an image sensor (line sensor and the like) for capturing an image of the ink-droplet deposition result of the print unit 12, and functions as a device to check for ejection defects such as clogs of the nozzles in the print unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the print heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern image printed by the print heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in the drawings, the paper output unit 26A for the target prints is provided with a sorter for collecting prints according to print orders.

Figure 3:
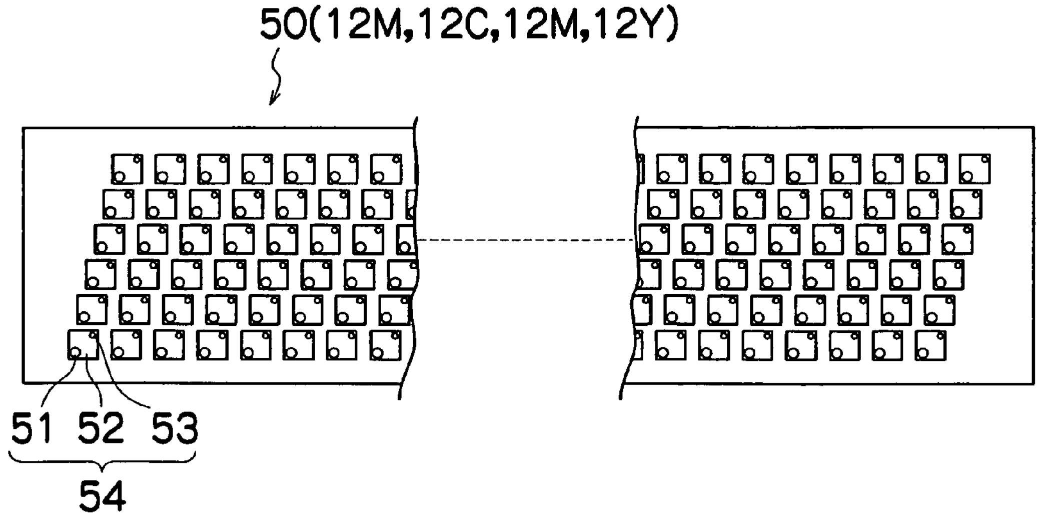
FIG. 3 is a plan perspective diagram showing an approximate view of the print head.

Next, the arrangement of nozzles (liquid ejection ports) in the print head (liquid ejection head) is described. The print heads 12K, 12C, 12M and 12Y provided for the respective ink colors each have the same structure, and a print head forming a representative embodiment of these print heads is indicated by the reference numeral 50. FIG. 3 shows a plan view perspective diagram of the print head 50.

As shown in FIG. 3, the print head 50 according to the present embodiment achieves a high density arrangement of nozzles 51 by using a two-dimensional staggered matrix array of pressure chamber units 54, each constituted by a nozzle for ejecting ink as ink droplets, a pressure chamber 52 for applying pressure to the ink in order to eject ink, and an ink supply port 53 for supplying ink to the pressure chamber 52 from a common liquid chamber (not shown in FIG. 3).

In the embodiment shown in FIG. 3, the pressure chambers 52 each have an approximately square planar shape when viewed from above, but the planar shape of the pressure chambers 52 is not limited to a square shape. As shown in FIG. 3, the nozzle 51 is formed at one end of a diagonal of each pressure chamber 52, and an ink supply port 53 is provided at the other end thereof.

Furthermore, although not shown in the drawings, one long full line head may be constituted by combining a plurality of short heads arranged in a two-dimensional staggered array, in such a manner that the combined length of this plurality of short heads corresponds to the full width of the print medium.

Figure 4A:
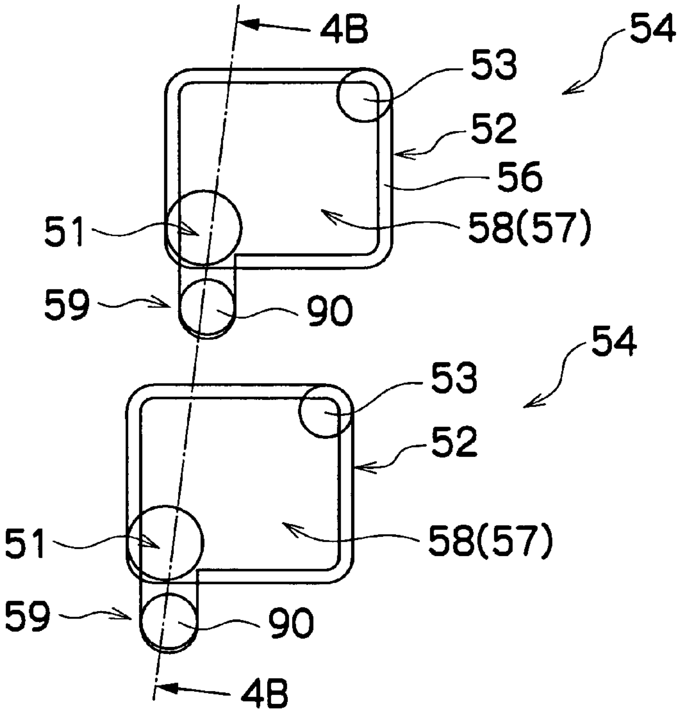
FIG. 4A is an enlarged diagram of a pressure chamber unit.

FIG. 4A shows an enlarged view of the pressure chamber units 54 constituting a portion of the print head 50 shown in FIG. 3 (FIG. 4A shows two pressure chamber units 54). Although omitted in FIG. 3, the upper surface of the pressure chambers 52 is formed by a diaphragm 56, and piezoelectric bodies 58 which cause the diaphragm 56 to deform are formed on top of the diaphragm 56. Individual electrodes 57 for driving the piezoelectric bodies 58 are formed on top of the piezoelectric bodies 58. The diaphragm 56 also serves as a common electrode for the piezoelectric bodies 58 opposing the individual electrodes 57. In this way, a piezoelectric element is constituted by sandwiching the piezoelectric body 58 from either side, between the individual electrode 57 and the common electrode (which also functions as the diaphragm 56).

Furthermore, a portion of each of the piezoelectric bodies 58 and the individual electrodes 57 is provided so as to extend outside the formation range of the pressure chamber 52, thereby forming a wire connection section 59, from which a drive wire 90 for supplying a drive signal to the individual electrode 57 is erected, so as to pass up substantially perpendicularly with respect to the surface on which the piezoelectric bodies 58 are formed.

Figure 4B:
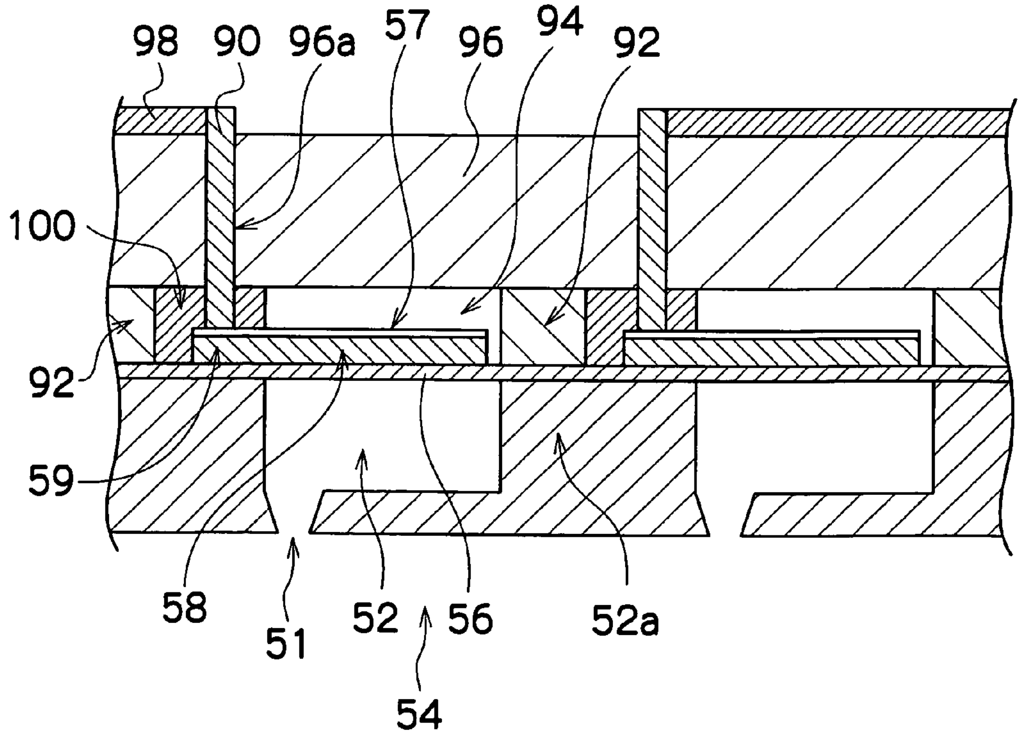
FIG. 4B is a cross-sectional diagram along line 4B-4B in FIG. 4A.

FIG. 4B shows a cross-sectional diagram along line 4B-4B in FIG. 4A.

As shown in FIG. 4B, when the pressure chamber unit 54 is observed in the direction of the cross-section, the nozzle 51 is formed on the base surface of the pressure chamber 52, and the upper surface of the pressure chamber 52 is constituted by the diaphragm 56. Furthermore, the diaphragm 56 also serves as the common electrode, as described previously, and the piezoelectric bodies 58 are formed on top of the diaphragm 56, and the individual electrodes 57 are formed on top of these piezoelectric bodies 58.

The piezoelectric body 58 and the individual electrode 57 form the wire connection section 59 which extends to the outside of the region of the pressure chamber 52, and the drive wire 90 is connected to this wire connection section 59. When a drive voltage is applied between the individual electrode 57 and the common electrode (diaphragm 56), by supplying a drive signal to the individual electrode 57, via the drive wire 90, the piezoelectric body 58 deforms.

In the present embodiment, the piezoelectric bodies 58 operate in the d31 mode (bending vibration mode), whereby the piezoelectric body 58 is displaced in a direction perpendicular to the direction of the applied electric field. More specifically, as shown in FIG. 4B, if an electric field is applied in the vertical direction in the drawing, from top and bottom between the individual electrode 57 and the common electrode (diaphragm 56), and passing through the piezoelectric body 58, then the piezoelectric body 58 extends or contracts in the lateral direction in the diagram and bends, thereby causing the diaphragm 56 to deform and be pushed in toward the pressure chamber 52. Thereby, the volume of the pressure chamber 52 is reduced and the ink inside the pressure chamber 52 is ejected from the nozzle 51.

Hence, in order to eject ink efficiently, it is necessary to prevent obstruction to the bending and deforming movement of the piezoelectric body 58. Therefore, in the present embodiment, a piezoelectric body cover 92 is provided about the periphery of each piezoelectric body 58, thereby forming a space 94 above the piezoelectric body 58 which prevents obstruction of the movement of the piezoelectric body 58.

The piezoelectric body cover 92 is formed to a prescribed thickness on the diaphragm 56 on top of the wall 52*a* of the pressure chamber 52, in such a manner that it is higher than the thickness of the piezoelectric body 58. By then forming a wiring substrate 96 thereon, the space 94 which provides a complete hermetic seal about the periphery of the piezoelectric body 58 is formed. By respectively forming the spaces 94 in this way, the piezoelectric bodies 58 can be driven without any obstruction to their movement.

Through holes 96*a* for forming the drive wires 90 are formed in the wiring substrate 96. Wires (upper wires) 98 for connecting to an external drive power supply (not shown) are provided over the wiring substrate 96, and are connected to the drive wires 90.

The periphery of the drive wire 90 in the section where the drive wire 90 makes contact with the wire connection section 59 is fixed by means of a photosensitive resin 100, which is described in more detail later.

Figure 5:
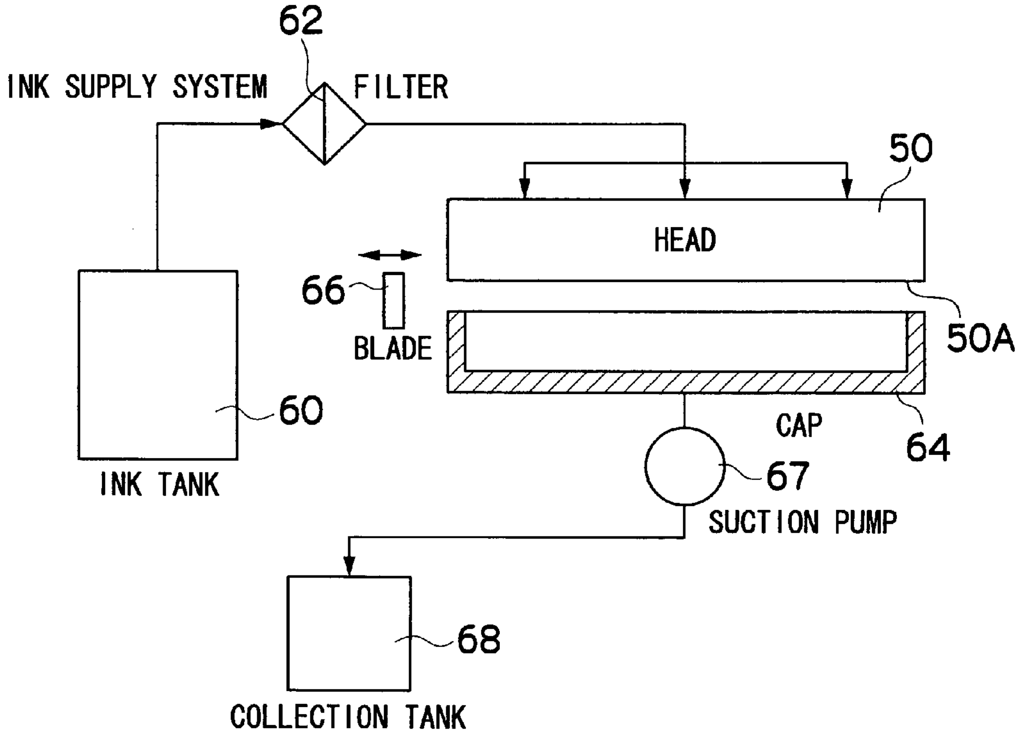
FIG. 5 is a schematic drawing showing an approximate view of an ink supply system in the inkjet recording apparatus.

FIG. 5 is a schematic drawing showing the configuration of the ink supply system in the inkjet recording apparatus 10. The ink tank 60 is a base tank that supplies ink to the print head 50 and is set in the ink storing and loading unit 14 described with reference to FIG. 1. The aspects of the ink tank 60 include a refillable type and a cartridge type: when the remaining amount of ink is low, the ink tank 60 of the refillable type is filled with ink through a filling port (not shown) and the ink tank 60 of the cartridge type is replaced with a new one. In order to change the ink type in accordance with the intended application, the cartridge type is suitable, and it is preferable to represent the ink type information with a bar code or the like on the cartridge, and to perform ejection control in accordance with the ink type. The ink tank 60 in FIG. 5 is equivalent to the ink storing and loading unit 14 in FIG. 1 described above.

A filter 62 for removing foreign matters and bubbles is disposed in the middle of channel connecting the ink tank 60 and the print head 50 as shown in FIG. 5. The filter mesh size in the filter 62 is preferably equivalent to or less than the diameter of the nozzle of the print head 50 and commonly about 20 μm.

Although not shown in FIG. 5, it is preferable to provide a sub-tank integrally to the print head 50 or nearby the print head 50. The sub-tank has a damper function for preventing variation in the internal pressure of the head and a function for improving refilling of the print head.

The inkjet recording apparatus 10 is also provided with a cap 64 as a device to prevent the nozzles from drying out or to prevent an increase in the ink viscosity in the vicinity of the nozzles, and a cleaning blade 66 as a device to clean the nozzle face 50A.

A maintenance unit including the cap 64 and the cleaning blade 66 can be relatively moved with respect to the print head 50 by a movement mechanism (not shown), and is moved from a predetermined holding position to a maintenance position below the print head 50 as required.

The cap 64 is displaced up and down relatively with respect to the print head 50 by an elevator mechanism (not shown). When the power of the inkjet recording apparatus 10 is turned OFF or when the apparatus is in a standby state for printing, the elevator mechanism raises the cap 64 to a predetermined elevated position so as to come into close contact with the print head 50, and the nozzle region of the nozzle surface 50A is thereby covered by the cap 64.

The cleaning blade 66 is composed of rubber or another elastic member, and can slide on the ink ejection surface (nozzle surface 50A) of the print head 50 by means of a blade movement mechanism (not shown). When ink droplets or foreign matter has adhered to the nozzle surface 50A, the nozzle surface 50A is wiped and cleaned by sliding the cleaning blade 66 on the nozzle surface 50A.

During printing or standby, when the frequency of use of specific nozzle 51 is reduced and ink viscosity increases in the vicinity of the nozzle 51, a preliminary discharge is made to eject the degraded ink resulting from an increase in ink viscosity toward the cap 64.

Also, when bubbles have become intermixed in the ink inside the print head 50 (ink inside the pressure chamber 52), the cap 64 is placed on the print head 50, the ink inside the pressure chamber 52 (the ink in which bubbles have become intermixed) is removed by suction with a suction pump 67, and the suction-removed ink is sent to a collection tank 68. This suction operation is also carried out in order to suction and remove degraded ink which has hardened due to increasing in viscosity when ink is loaded into the print head for the first time, and when the print head starts to be used after having been out of use for a long period of time.

More specifically, when a state in which ink is not ejected from the print head 50 continues for a certain amount of time or longer, the ink solvent in the vicinity of the nozzles 51 evaporates and ink viscosity increases. In such a state, ink can no longer be ejected from the nozzle 51 even if the piezoelectric body 58 which is an actuator for the ejection driving is operated. Before reaching such a state (in a viscosity range that allows ejection by the operation of the piezoelectric body 58) the piezoelectric body 58 is operated to perform the preliminary discharge to eject the ink whose viscosity has increased in the vicinity of the nozzle toward the ink receptor. After the nozzle surface 50A is cleaned by a wiper such as the cleaning blade 66 provided as the cleaning device for the nozzle face 50A, a preliminary discharge is also carried out in order to prevent the foreign matter from becoming mixed inside the nozzles 51 by the wiper sliding operation. The preliminary discharge is also referred to as "dummy discharge", "purge", "liquid discharge", and so on.

When bubbles have become intermixed inside the nozzle 51 or the pressure chamber 52, or when the ink viscosity inside the nozzle 51 has increased over a certain level, ink can no longer be ejected by the preliminary discharge, and a suctioning action is carried out as follows.

More specifically, when bubbles have become intermixed in the ink inside the nozzle 51 and the pressure chamber 52, ink can no longer be ejected from the nozzle 51 even if the piezoelectric body 58 is operated. Also, when the ink viscosity inside the nozzle 51 has increased over a certain level, ink can no longer be ejected from the nozzle 51 even if the piezoelectric body 58 is operated. In a case of this kind, the cap 64 is placed on the nozzle surface 50A of the print head 50, and the ink containing air bubbles or the ink of increased viscosity inside the pressure chambers 52 is suctioned by a pump 67.

However, since this suction action is performed with respect to all the ink in the pressure chambers 52, the amount of ink consumption is considerable. Therefore, a preferred aspect is one in which a preliminary discharge is performed when the increase in the viscosity of the ink is small. The cap 64 shown in FIG. 5 functions as a suctioning device and it may also function as an ink receptacle for preliminary ejection.

Moreover, desirably, the inside of the cap 64 is divided by means of partitions into a plurality of areas corresponding to the nozzle rows, thereby achieving a composition in which suction can be performed selectively in each of the demarcated areas, by means of a selector, or the like.

Figure 6:
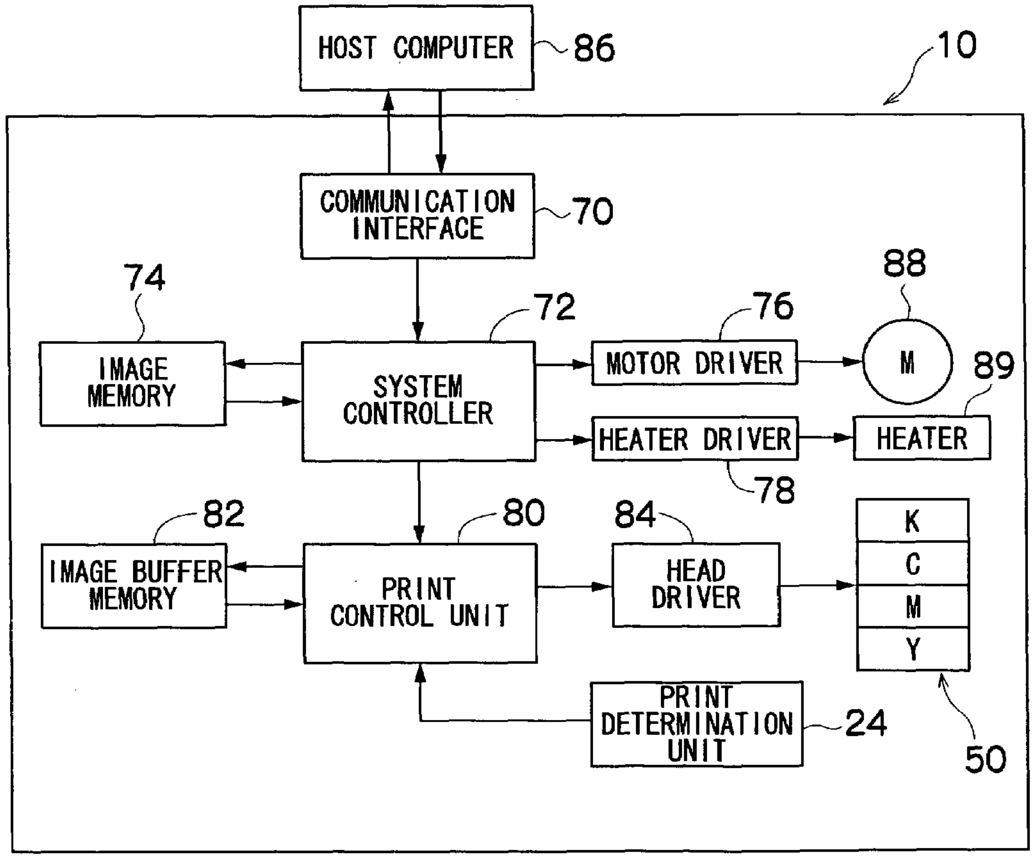
FIG. 6 is a block diagram showing the system composition of the inkjet recording apparatus.

FIG. 6 is a principal block diagram showing the system configuration of the inkjet recording apparatus 10. The inkjet recording apparatus 10 comprises a communication interface 70, a system controller 72, an image memory 74, a motor driver 76, a heater driver 78, a print controller 80, an image buffer memory 82, a head driver 84, and the like.

The communication interface 70 is an interface unit for receiving image data sent from a host computer 86. A serial interface such as USB, IEEE1394, Ethernet, wireless network, or a parallel interface such as a Centronics interface may be used as the communication interface 70. A buffer memory (not shown) may be mounted in this portion in order to increase the communication speed. The image data sent from the host computer 86 is received by the inkjet recording apparatus 10 through the communication interface 70, and is temporarily stored in the image memory 74. The image memory 74 is a storage device for temporarily storing images inputted through the communication interface 70, and data is written and read to and from the image memory 74 through the system controller 72. The image memory 74 is not limited to a memory composed of semiconductor elements, and a hard disk drive or another magnetic medium may be used.

The system controller 72 is a control unit for controlling the various sections, such as the communications interface 70, the image memory 74, the motor driver 76, the heater driver 78, and the like. The system controller 72 is constituted by a central processing unit (CPU) and peripheral circuits thereof, and the like, and in addition to controlling communications with the host computer 86 and controlling reading and writing from and to the image memory 74, or the like, it also generates a control signal for controlling the motor 88 of the conveyance system and the heater 89.

The motor driver (drive circuit) 76 drives the motor 88 in accordance with commands from the system controller 72. The heater driver (drive circuit) 78 drives the heater 89 of the post-drying unit 42 or the like in accordance with commands from the system controller 72.

The print controller 80 has a signal processing function for performing various tasks, compensations, and other types of processing for generating print control signals from the image data stored in the image memory 74 in accordance with commands from the system controller 72 so as to supply the generated print control signals (print data) to the head driver 84. Prescribed signal processing is carried out in the print controller 80, and the ejection amount and the ejection timing of the ink droplets from the respective print heads 50 are controlled via the head driver 84, on the basis of the print data. By this means, prescribed dot size and dot positions can be achieved.

The print controller 80 is provided with the image buffer memory 82; and image data, parameters, and other data are temporarily stored in the image buffer memory 82 when image data is processed in the print controller 80. The aspect shown in FIG. 6 is one in which the image buffer memory 82 accompanies the print controller 80; however, the image memory 74 may also serve as the image buffer memory 82. Also possible is an aspect in which the print controller 80 and the system controller 72 are integrated to form a single processor.

The head driver 84 drives the actuators 58 of the print heads 50 of the respective colors on the basis of print data supplied by the print controller 80. The head driver 84 can be provided with a feedback control system for maintaining constant drive conditions for the print heads.

The print determination unit 24 is a block that includes the line sensor (not shown) as described above with reference to FIG. 1, reads the image printed on the recording paper 16, determines the print conditions (presence of the ejection, variation in the dot formation, and the like) by performing desired signal processing, or the like, and provides the determination results of the print conditions to the print controller 80.

According to requirements, the print controller 80 makes various corrections with respect to the print head 50 on the basis of information obtained from the print determination unit 24.

Next, a method of manufacturing the print head 50 (liquid ejection head) according to the first embodiment of the present invention is described.

FIGS. 7A to 7F show the sequence of steps in the method of manufacture according to the present embodiment.

Figure 7A:
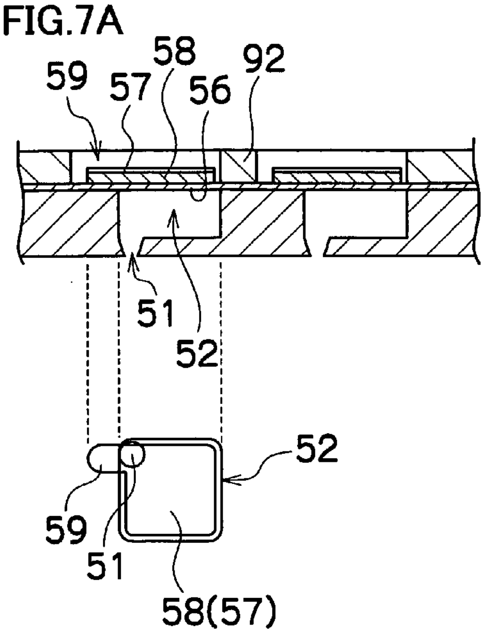
FIGS. 7A to 7F are illustrative diagrams showing steps for forming a print head according to a first embodiment of the present invention.

Firstly, as shown in FIG. 7A, pressure chambers 52 connected to nozzles 51 and an ink supply channel (not shown), a diaphragm 56 forming the ceiling of the pressure chambers 52, piezoelectric bodies 58 situated on top of the diaphragm 56, individual electrodes 57 situated on top of the piezoelectric bodies 58, and piezoelectric body covers 92 for creating spaces that prevent obstruction of the movement of the piezoelectric bodies 58, situated about the periphery of the piezoelectric bodies 58, are formed.

In this case, as shown in the plan diagram of the pressure chamber 52 in the lower part of FIG. 7A, a portion of the individual electrode 57 of each piezoelectric body 58 is extended to the outside of the pressure chamber 52, so as to form a wire connection section 59 for connecting to a drive wire.

Figure 7B:
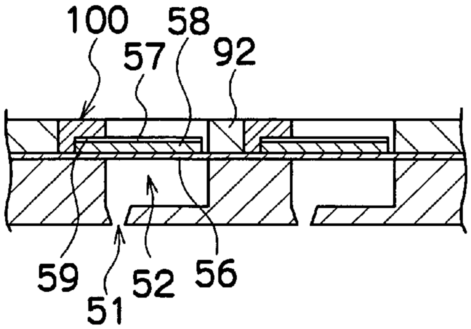

Thereupon, as shown in FIG. 7B, a positive-type photosensitive resin 100, which dissolves if exposed to light, is applied to the same height as the piezoelectric body covers 92, so as to cover the wire connection sections 59, while not being applied to the regions of pressure chamber 52. There are no particular limitations on the method of applying the photosensitive resin 100, but a method such as screen printing, for instance, would be suitable.

Figure 7C:
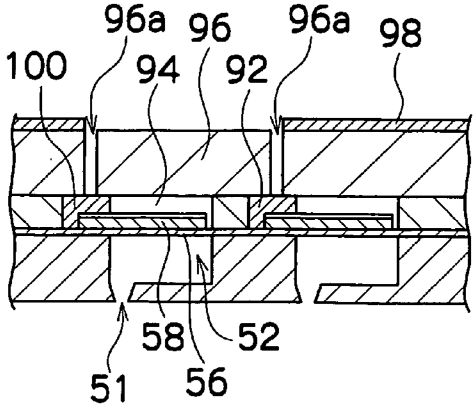

Next, as shown in FIG. 7C, the photosensitive resin 100 having been applied as stated above is baked, whereupon an upper structural body, such as a wiring substrate 96, previously formed with through holes 96*a* for forming drive wires, as well as upper wires 98, and the like, is arranged on top of the piezoelectric body covers 92 and the baked and solidified photosensitive resin 100.

Figure 7D:
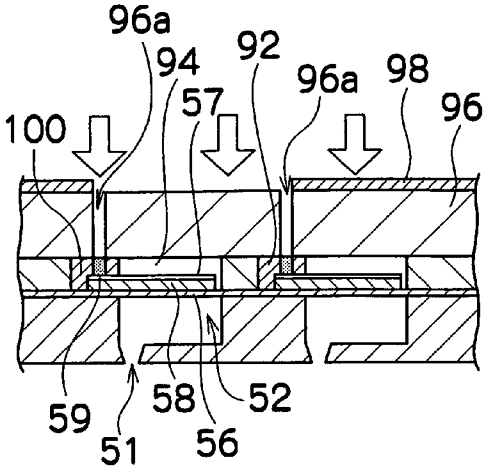

Next, as shown in FIG. 7D, light is irradiated from above, and the photosensitive resin 100 is exposed to light, using the upper structural body, such as the wiring substrate 96 formed with through holes 96*a*, as a mask.

Figure 7E:
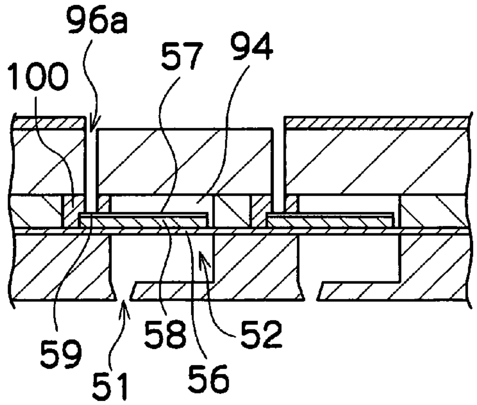

As shown in FIG. 7E, when the photosensitive resin 100 thus exposed is subsequently developed, only the portions which have been irradiated with light via the through holes 96*a* are dissolved and removed, and therefore, holes which form straight lines with the through holes 96*a* of the wiring substrate 96 are formed, passing through respectively to the wiring connection sections 59 of the individual electrodes 57 on the piezoelectric bodies 58.

Figure 7F:
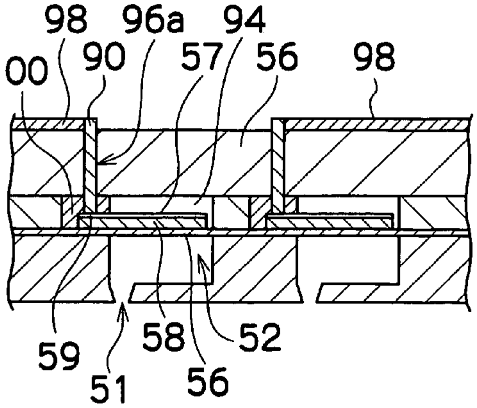

Finally, as shown in FIG. 7F, a conductive paste is filled into the holes connecting the upper wires 98 and the wiring connection sections 59, by means of a commonly known technique, such as vacuum printing, or the like. Thereby, drive wires are formed and a print head is completed.

In this way, in the present embodiment, since the wire connection sections 59 are covered with the photosensitive resin 100 up to the same height as the piezoelectric body covers 92, and the holes which form straight lines with the through holes 96*a* in the wiring substrate 96 pass through to the wiring connection sections 59, then even if the conductive paste or solder flows into the through holes 96*a* from above, it does not flow out into the spaces 94 provided in order to prevent obstruction to the movement of the piezoelectric bodies 58, and hence this movement is not impeded during driving of the piezoelectric bodies 58.

Moreover, since the upper structural body, such as the wiring substrate 96, is used as a light exposure mask, then positional registration is not required, and the holes provided over the wiring connection sections 59 are automatically aligned with the through holes 96*a* in the wiring substrate 96.

Furthermore, since the wiring connection sections 59 to the piezoelectric bodies 58 are fixed by the photosensitive resin 100, it is possible to prevent disconnection of the electrical connection sections as the piezoelectric bodies 58 are driven.

Figure 8:
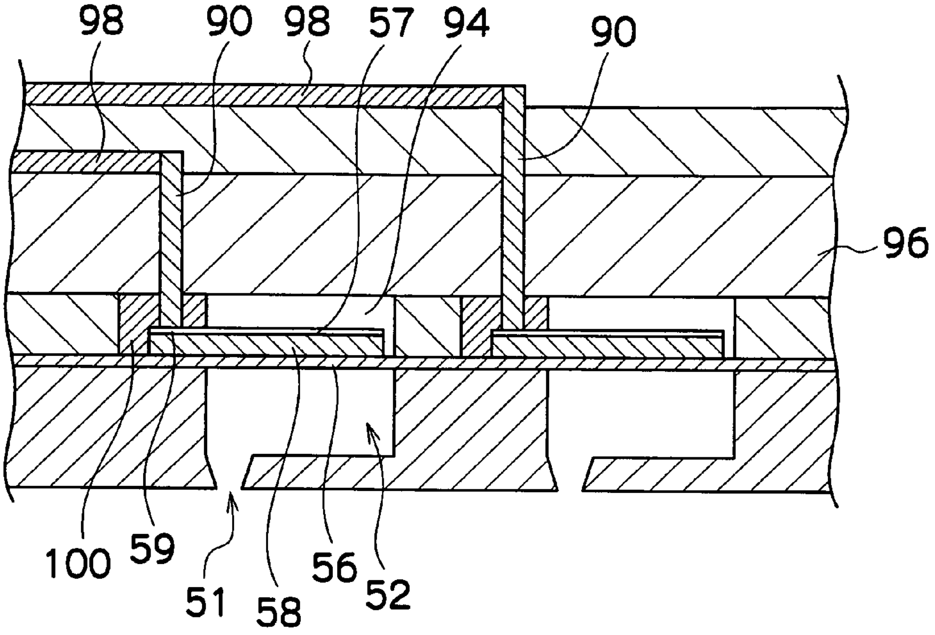
FIG. 8 is a cross-sectional diagram showing an embodiment of the print head in which the upper wires are formed in multiple layers.

In the embodiment shown in FIGS. 7C to 7F, the upper wires 98 are disposed in the same plane, but in order to achieve even higher density of the wiring, it is also possible to form the upper wires 98 in multiple layers, as shown in FIG. 8, for example.

Figure 9:
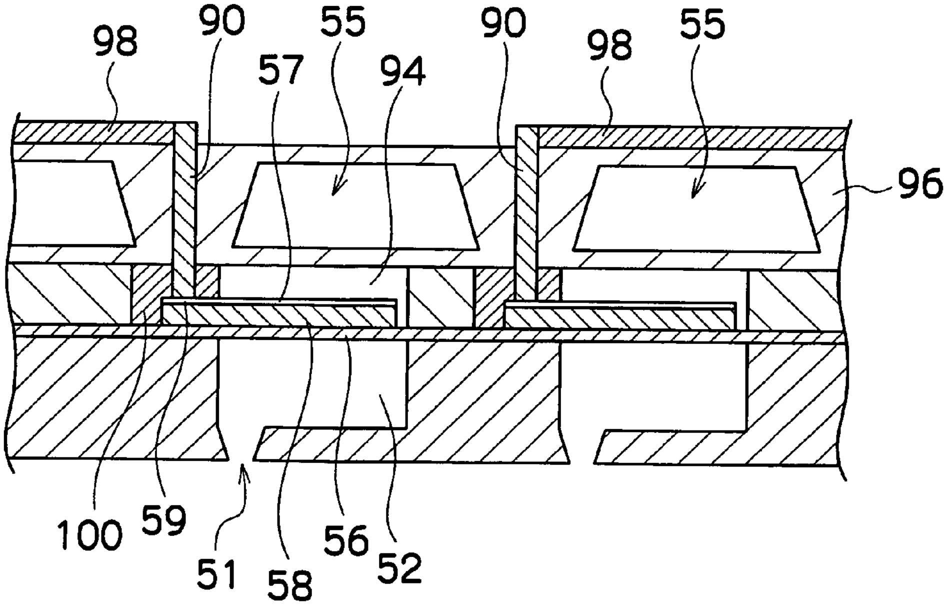
FIG. 9 is a cross-sectional diagram showing an embodiment in which an ink supply path is formed inside a wiring substrate.

Moreover, as shown in FIG. 9, it is also possible to provide the common liquid chamber 55 for supplying ink to the pressure chambers 52, in the wiring substrate 96. If the common liquid chamber 55 is provided to the upper side of the pressure chambers 52 in this way, and ink is supplied to the pressure chambers 52 from above, then it is possible to arrange the pressure chambers 52 at even higher density, and furthermore, it is also possible to improve the ink refilling characteristics, and to handle the ejection of high-viscosity ink.

There are no particular restrictions on the method of manufacturing the wiring substrate 96 having the common liquid chamber 55 therein, and it is possible to form the wiring substrate 96 by resin molding using a commonly known method, such as transfer molding, for example.

Next, the method of manufacturing a print head 50 according to a second embodiment of the present invention is described.

In the present embodiment, the piezoelectric body covers 92 for forming spaces that prevent obstruction of the movement of the piezoelectric bodies 58, and the portions which cover the bonding sections between the drive wires 90 and the wire connection sections 59, are formed in an integrated fashion.

FIGS. 10A to 10D show the sequence of steps in the method of manufacturing a print head according to the present embodiment.

Figure 10A:
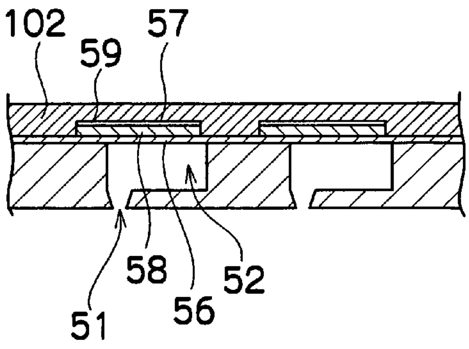
FIGS. 10A to 10D are illustrative diagrams showing steps for forming a print head according to a second embodiment of the present invention.

Firstly, as shown in FIG. 10A, pressure chambers 52 connected to nozzles 51 and an ink supply channel (not shown), and a diaphragm 56 forming the ceiling of the pressure chambers 52 are formed, whereupon piezoelectric bodies 58 and individual electrodes 57 are formed on the diaphragm 56 in the regions corresponding to the pressure chambers 52, and a positive-type photosensitive resin 102 is applied over same. The photosensitive resin 102 is applied on top of the piezoelectric bodies 58 having the individual electrodes 57, and also applied over the whole surface of the diaphragm 56.

Figure 10C:
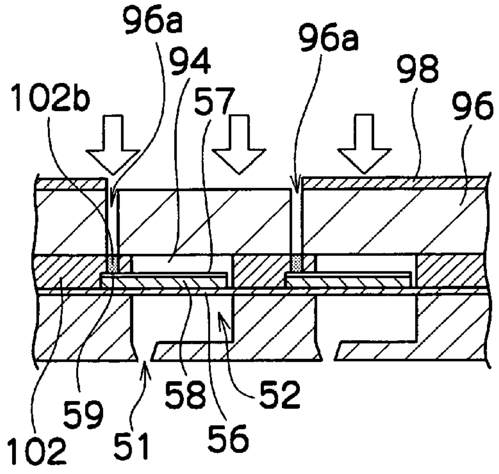
Figure 10B:
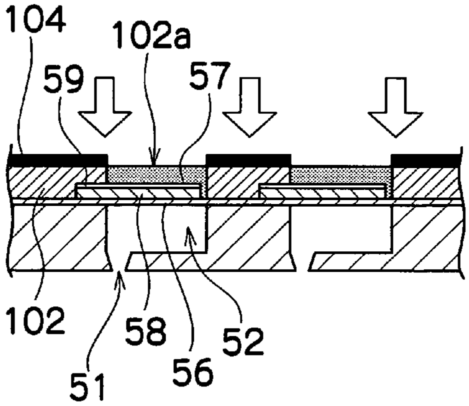

Next, as shown in FIG. 10B, after baking and fixing the photosensitive resin 102 having been applied, light is irradiated via a mask 104 so that sections 102*a* of the photosensitive resin 102 corresponding to the piezoelectric bodies 58 over the pressure chambers 52 are exposed to light. Thereupon, these sections 102*a* are removed by developing, and portions forming spaces 94 for preventing obstruction to the movement of the piezoelectric bodies 58 are thus created.

As shown in FIG. 10C, an upper structural body, such as a wiring substrate 96, formed previously with through holes 96*a* is then arranged on top of the photosensitive resin layer 102, in which sections that are to create the spaces 94 surrounding the piezoelectric bodies 58 have been formed. Using this upper structural body as a mask, light is irradiated and passes down the through holes 96*a*, thus exposing the sections 102*b* of the photosensitive resin layer 102 that correspond to the wiring connection sections 59 extended from the individual electrodes 57.

Figure 10D:
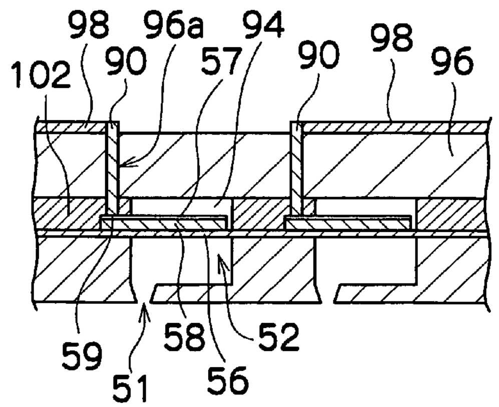

As shown in FIG. 10D, the sections 102*b* thus exposed are developed and removed, thereby forming holes which pass through to the wiring connection sections 59 in straight lines from the through holes 96*a*, a conductive paste is filled into these holes, by means of a technique such as screen printing, for instance, thereby making the interior of the holes electrically conductive, and thus forming drive wires which electrically connect the upper wires 98 with the electrical connection sections 59.

In the present embodiment, since the photosensitive resin which covers the piezoelectric body covers and the wiring connection sections is formed integrally, the manufacturing process for the print head becomes simpler.

In the present embodiment, it is also possible to form the upper wires 98 in a multiple layer fashion as shown in FIG. 8, and it is also possible to form the common liquid chamber 55 inside the wiring substrate 96 as shown in FIG. 9.

In the embodiments described above, the diaphragm 56 also serves as the common electrode, and the drive wires 90 are extended only from the individual electrodes 57 formed on the upper side of the piezoelectric bodies 58, but it is also possible to form common electrodes separately from the diaphragm 56, to the lower side of the piezoelectric bodies 58, and to extend wires from these common electrodes in such a manner that two wires are extended from each of the piezoelectric bodies 58.

Figure 11:
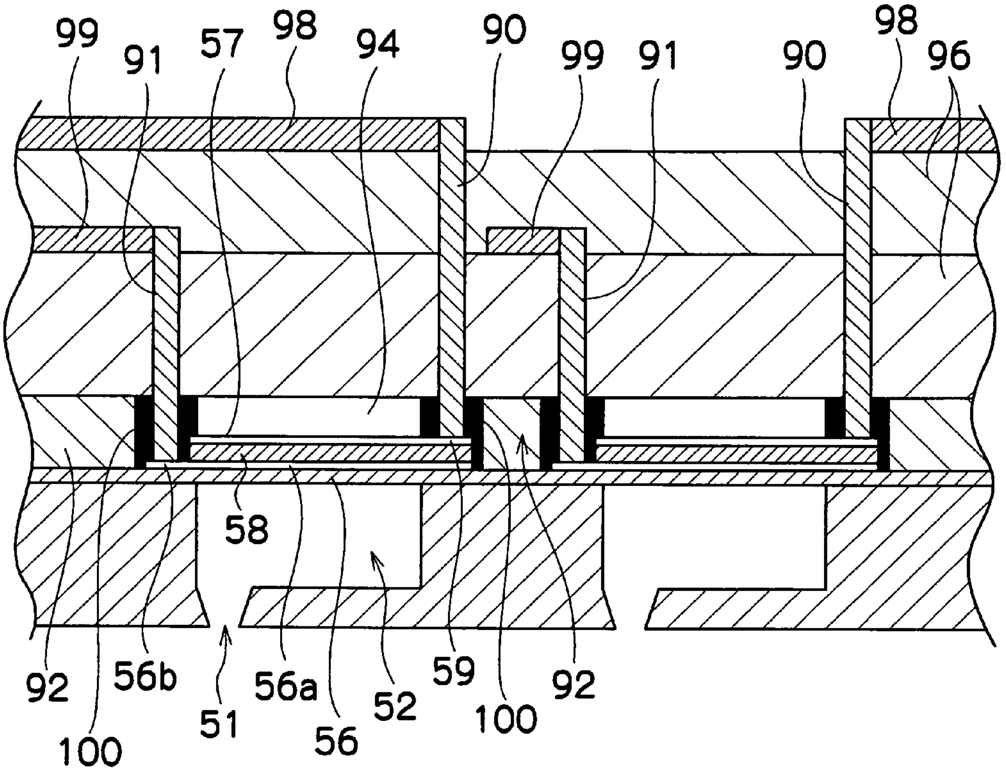
FIG. 11 is a cross-sectional diagram showing an embodiment in which two wires are extended from each piezoelectric body.

More specifically, as shown in FIG. 11, the piezoelectric bodies 58 are formed in positions that correspond to the regions of the pressure chambers 52 on the diaphragm 56, individual electrodes 57 are formed on the upper side of the piezoelectric bodies 58, and common electrodes 56*a* are formed between the piezoelectric bodies 58 and the diaphragm 56, in such a manner that each of the piezoelectric bodies 58 is sandwiched from above and below by the individual electrode 57 and the common electrode 56*a*.

Piezoelectric body covers 92 are formed on the diaphragm 56 about the periphery of the piezoelectric bodies 58, thereby forming spaces 94 above the piezoelectric bodies 58 which prevent obstruction to the driving of the piezoelectric bodies 58. Furthermore, the individual electrodes 57 of the piezoelectric bodies 58 project to the outside of the pressure chambers 52 (in FIG. 11, the right-hand sides of the pressure chambers 52), thereby forming wire connection sections 59. Moreover, on the other hand, the common electrodes 56*a* are also made to project to the outside of the pressure chambers 52 (in FIG. 11, the left-hand side of the pressure chambers 52), thereby forming wire connection sections 56*b*. The peripheries of the wire connection sections 59 and 56*b* are fixed by the photosensitive resin 100.

A wiring substrate 96 having through holes 96*a* is arranged on top of the piezoelectric body covers 92, and as described above, holes are formed in straight lines from the through holes 96*a*, passing through the photosensitive resin 100 and up to the wiring connections 59 and 56*b*, and conductive paste, or the like, is filled into these holes, thereby respectively creating electrical connections between the upper wires 98 and 99 and the wire connection sections 59 and 56*b*. In this way, two wires are extended from each piezoelectric body 58.

In the embodiments described above, the wiring substrate which has upper wires previously formed thereon is used, but it is also possible to use a simple substrate having no upper wires of this kind, and to extend perpendicular drive wires 90 simply onto this substrate, whereupon a multi-layer flexible cable or a flexible printed circuit (FPC) is arranged thereon and the drive wires 90 are connected to the wires in the multi-layer flexible cable by means of soldering, or the like.

As described above, according to the embodiments of the present invention, photosensitive resin is disposed in the vicinity of the wire connection sections inside the spaces formed surrounding the upper portions of the piezoelectric bodies, in such a manner that there is no obstruction of the movement of the piezoelectric bodies, and using a substrate formed with through holes placed on top of this resin, as a mask, the photosensitive resin is exposed to light and developed, thereby opening holes which penetrate through to the wire connection sections, whereupon conductive paste, or the like, is introduced into these holes in order to form drive wires. Consequently, the conductive paste introduced into the holes does not flow to any parts other than the required locations inside the spaces, and hence it does not impede the movement of the piezoelectric bodies.

Furthermore, since a substrate formed with through holes is used as a mask in the light exposure step, then positional registration of the holes is not necessary, and furthermore, since the periphery of each wire connection section is fixed by photosensitive resin, then it is possible to prevent disconnections in the connection sections, due to vibrations caused by driving of the piezoelectric bodies.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A liquid ejection head, comprising:

a diaphragm which forms a portion of pressure chambers connected to nozzles ejecting liquid;

piezoelectric elements which deform the diaphragm;

a photosensitive resin which is applied on at least a portion of each of electrodes of the piezoelectric elements;

a substrate having through holes which is bonded to the photosensitive resin on a side reverse to a side adjacent to the piezoelectric elements; and wires which pass through the substrate and the photosensitive resin, and connect electrically to the electrodes of the piezoelectric elements.

2. The liquid ejection head as defined in claim 1, wherein:

spaces allowing the piezoelectric elements to bend are provided respectively between the piezoelectric elements and the substrate; and the piezoelectric elements are driven in a bending vibration mode.

3. The liquid ejection head as defined in claim 1, wherein the substrate has a common liquid chamber which accumulates the liquid to be supplied to the pressure chambers.

4. An image forming apparatus, comprising the liquid ejection head as defined in claim 1.

5. A method of manufacturing a liquid ejection head having a diaphragm which forms a portion of pressure chambers connected to nozzles ejecting liquid, and piezoelectric elements which deform the diaphragm, the method comprising the steps of:

applying a photosensitive resin on at least a portion of each of electrodes of the piezoelectric elements;

bonding a substrate having through holes, to the photosensitive resin;

exposing the photosensitive resin via the through holes;

developing the exposed photosensitive resin, thereby forming holes connecting to the through holes in the photosensitive resin; and filling conductive material into the through holes and the holes formed in the photosensitive resin.

6. A method of manufacturing a liquid ejection head having a diaphragm which forms a portion of pressure chambers connected to nozzles ejecting liquid, and piezoelectric bodies on top of the diaphragm, electrodes on top of the piezoelectric bodies and piezoelectric body covers on the periphery of the piezoelectric bodies, the method comprising the steps of:

applying a photosensitive resin on at least a portion of each of the electrodes on top of the piezoelectric bodies;

bonding a substrate having through holes, to the photosensitive resin;

exposing the photosensitive resin via the through holes;

developing the exposed photosensitive resin, thereby forming holes connecting to the through holes in the photosensitive resin; and filling conductive material into the through holes and the holes formed in the photosensitive resin, wherein the photosensitive resin is applied to the same height as the piezoelectric body covers, but is not applied directly on any region of the pressure chambers.

* * * * *